United States Patent
Aoki et al.

(10) Patent No.: US 9,112,123 B2
(45) Date of Patent: Aug. 18, 2015

(54) LIGHT-EMITTING DEVICE

(75) Inventors: Kazuo Aoki, Tokyo (JP); Makoto Watanabe, Tokyo (JP); Kiyoshi Shimamura, Tsukuba (JP); Villora Encarnacion Antonia Garcia, Tsukuba (JP)

(73) Assignee: NATIONAL INSTITUTE FOR MATERIALS SCIENCE, Tsukuba-Shi, Ibaraki (JP)

( * ) Notice: Subject to any disclaimer, the term of this patent is extended or adjusted under 35 U.S.C. 154(b) by 67 days.

(21) Appl. No.: 13/882,037

(22) PCT Filed: Oct. 28, 2011

(86) PCT No.: PCT/JP2011/074960
§ 371 (c)(1),
(2), (4) Date: May 24, 2013

(87) PCT Pub. No.: WO2012/057330
PCT Pub. Date: May 3, 2012

(65) Prior Publication Data
US 2013/0256730 A1    Oct. 3, 2013

(30) Foreign Application Priority Data
Oct. 29, 2010    (JP) .................. 2010-243079

(51) Int. Cl.
*H01L 33/00*    (2010.01)
*H01L 33/50*    (2010.01)
(Continued)

(52) U.S. Cl.
CPC .......... *H01L 33/502* (2013.01); *C09K 11/7774* (2013.01); *H01L 33/505* (2013.01);
(Continued)

(58) Field of Classification Search
CPC ................ H01L 33/502; H01L 33/505; H01L 2224/48091; H01L 2924/00014
USPC ............................................. 257/98, E33.061
See application file for complete search history.

(56) References Cited

U.S. PATENT DOCUMENTS 6,630,691 B1 *   10/2003   Mueller-Mach et al. ........ 257/84
2005/0006659 A1 *   1/2005   Ng et al. .......................... 257/99
(Continued)

FOREIGN PATENT DOCUMENTS

CN    1815765 A    8/2006
CN    101872831 A   10/2010
(Continued)

OTHER PUBLICATIONS
International Search Report (ISR) (PCT Form PCT/ISA/210) dated Jan. 31, 2012, in PCT/JP2011/074960.
(Continued)

*Primary Examiner* — Victor A Mandala
(74) *Attorney, Agent, or Firm* — McGinn IP Law Group, PLLC (57) ABSTRACT

[Problem] To provide a light-emitting device which does not undergo the deterioration in luminous efficiency associated with the long-term use.
[Solution] A light-emitting device (1) comprises a light-emitting element (10) which can emit blue light and a phosphor (2) which is composed of a single kind of single crystal and can emit yellow light upon the irradiation with the light emitted from the light-emitting element (10) which serves as excitation light. Thus, it becomes possible to prevent the deterioration in luminous efficiency associated with the deterioration in a binder or the like compared with a light-emitting device which utilizes multiple kinds of granular phosphors, because any binder for binding phosphors to each other is not required in the light-emitting device (1).

14 Claims, 5 Drawing Sheets

(51) Int. Cl.
*C09K 11/77* (2006.01)
*H05B 33/14* (2006.01)

(52) U.S. Cl.
CPC ............ *H05B 33/14* (2013.01); *H01L 2224/13* (2013.01); *H01L 2224/48091* (2013.01); *H01L 2224/49107* (2013.01)

(56) References Cited

U.S. PATENT DOCUMENTS

| | | | |
|---|---|---|---|
| 2008/0283864 A1* | 11/2008 | LeToquin et al. | 257/101 |
| 2009/0008663 A1 | 1/2009 | Shimizu et al. | |
| 2010/0200874 A1* | 8/2010 | Shioi et al. | 257/91 |
| 2010/0219428 A1* | 9/2010 | Jung et al. | 257/89 |
| 2010/0264438 A1 | 10/2010 | Suenaga | |
| 2014/0084323 A1* | 3/2014 | Shimizu et al. | 257/98 |

FOREIGN PATENT DOCUMENTS

| | | |
|---|---|---|
| EP | 1142034 A1 | 10/2001 |
| EP | 2158292 A2 | 3/2010 |
| JP | 2001-203383 A | 7/2001 |
| JP | 2002-141559 A | 5/2002 |
| JP | 2003-204079 A | 7/2003 |
| JP | 2003-204080 A | 7/2003 |
| JP | 2005-5544 A | 1/2005 |
| JP | 2005-57239 A | 3/2005 |
| JP | 2005-146172 A | 6/2005 |
| JP | 2006-265542 A | 10/2006 |
| JP | 2007-300134 A | 11/2007 |
| JP | 2010-155891 A | 7/2010 |
| JP | 2010-272847 A | 12/2010 |

OTHER PUBLICATIONS

European Search Report dated Jan. 7, 2015.

* cited by examiner

LIGHT-EMITTING DEVICE

TECHNICAL FIELD

This invention relates to a light-emitting device.

BACKGROUND ART

A light-emitting device is known that is provided with a light-emitting element comprised of an LED (light emitting diode) to emit a blue light and a phosphor to be excited by receiving the light from the light-emitting element so as to emit a yellow light and that is to produce a white light by the mixture of the emitted lights (see, e.g., Patent Literature 1).

The light-emitting device disclosed in Patent Literature 1 is configured such that an epoxy resin containing particulate phosphors is disposed around the light-emitting element to emit the blue light so that the white light is produced by mixing the light emitted from the light-emitting element and the yellow light emitted from the phosphors.

PRIOR ART DOCUMENT

Patent Literature

[Patent Literature 1] JP-A-2010-155891

SUMMARY OF THE INVENTION

Problems to be Solved by the Invention

In the light-emitting device configured as described above, when a binding agent (binder) such as an epoxy resin for binding particulate phosphors deteriorates due to long-term use, etc., a light transmission rate decreases and this leads to deterioration in luminous efficiency. Meanwhile, grains of individual particulate phosphors are desirably small in order to suppress unevenness in emission color. However, since the surface area of the phosphor with respect to volume of the phosphor increases with decreasing a grain size, it is likely to be affected by external environment such as moisture and also a non-emitting region becomes relatively large due to the non-uniformity of composition or low crystalline quality near the surface. Accordingly, excitation efficiency of the phosphor decreases, resulting in deterioration in luminous efficiency of the light-emitting device.

Thus, it is an object of the invention to provide a light-emitting device that allows the suppression of deterioration in luminous efficiency associated with a long-term use as compared to the case of using particulate phosphors.

Means for Solving the Problems

[1] A light-emitting device, comprising:
a light-emitting element to emit a blue light; and
a phosphor comprising a single monocrystal to emit a yellow light by being excited by the light emitted from the light-emitting element.

[2] The light-emitting device according to [1], wherein the phosphor comprises a composition represented by Y3-x-yLxMyAl5-zNzO12-w, where L is Gd or Lu, M is one or more elements selected from the group consisting of Ce, Tb, Eu, Yb, Pr, Tm and Sm, N is Ga or In, $0 \leq x < 3$, $0 < y \leq 1$, $0 \leq z \leq 5$ and $-0.2 \leq w \leq 0.2$.

[3] The light-emitting device according to [1], wherein the phosphor comprises a composition represented by Tb3-x-yGdxMy(Sc, Lu)2-zAl3-wNz+wO12-v, where M is one or more elements selected from the group consisting of Ce, Eu, Yb, Pr, Tm and Sm, N is Ga or In, $0 \leq x \leq 3$, $0 \leq y \leq 1$, $0 \leq z \leq 2$, $0 \leq w \leq 3$ and $-0.2 \leq v \leq 0.2$.

[4] The light-emitting device according to [3], wherein the z of the phosphor is in a range of $0.5 \leq z \leq 2$.

[5] The light-emitting device according to [1], wherein the phosphor comprises a composition represented by Tb3-x-yGdxMy(Sc, Lu)vN5-vO12-w, where M is at least one or more elements selected from the group consisting of Ce, Eu, Yb, Pr, Tm, Sm, Nd, Dy, Ho and Er, N is at least one or more elements selected from the group consisting of Ga, In and Al, $0 \leq x < 3$, $0 < y \leq 1$, $0 \leq v \leq 5$ and $-0.2 \leq w \leq 0.2$.

[6] The light-emitting device according to [1], wherein the phosphor comprises a composition represented by Y3-x-yGdxMyLvN5-vO12-w, where L is at least one or more elements selected from Sc and Lu, M is one or more elements selected from the group consisting of Ce, Tb, Eu, Yb, Pr, Tm, Sm, Nd, Dy, Ho and Er, N is at least one or more elements selected from Ga, In and Al, $0 \leq x < 3$, $0 < y \leq 1$, $0 \leq v \leq 5$ and $-0.2 \leq w \leq 0.2$.

[7] The light-emitting device according to [5] or [6], wherein the v of the phosphor is in a range of $0.5 \leq v \leq 2$.

[8] The light-emitting device according to any one of [2] to [7], wherein the y of the phosphor is in a range of $0.003 \leq y \leq 0.2$.

[9] The light-emitting device according to any one of [2] to [8], wherein the y of the phosphor is in a range of $0.01 \leq y \leq 0.2$.

Effects of the Invention

According to the invention, a light-emitting device can be provided that allows the suppression of deterioration in luminous efficiency associated with a long-term use as compared to the case of using particulate phosphors.

MODE FOR CARRYING OUT THE INVENTION

First Embodiment

The first embodiment of the invention will be described in reference to FIGS. 1A and 1B.

Figure 1A:
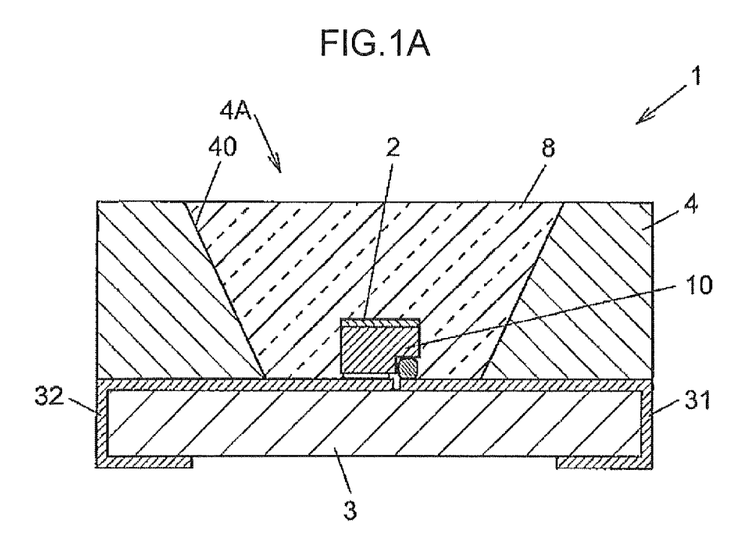
FIG. 1A is a cross sectional view showing a light-emitting device in a first embodiment of the present invention.

FIG. 1A is a cross sectional view showing a light-emitting device 1 in the first embodiment of the invention. FIG. 1B is a cross sectional view showing a light-emitting element 10 constituting the light-emitting device 1 shown in FIG. 1A and the periphery thereof.

As shown in FIG. 1A, the light-emitting device 1 is composed of the light-emitting element 10 which is an LED, a phosphor 2 formed of a single monocrystal provided so as to cover a light-emitting surface of the light-emitting element 10, a ceramic substrate 3 formed of $Al_2O_3$, etc., for supporting the light-emitting element 10, a main body 4 formed of a white resin and a transparent resin 8 for sealing the light-emitting element 10 and the phosphor 2.

The ceramic substrate 3 has wiring parts 31 and 32 formed by patterning a metal such as tungsten. The wiring parts 31 and 32 are electrically connected to an n-side electrode 15A and a p-side electrode 15B (described later) of the light-emitting element 10.

The main body 4 is formed on the ceramic substrate 3 so as to have an opening 4A formed in the middle thereof. The opening 4A is formed in a tapered shape of which opening width increases from the ceramic substrate 3 side toward the outside. The inner surface of the opening 4A is a reflecting surface 40 for reflecting emission light of the light-emitting element 10 toward the outside.

Figure 1B:
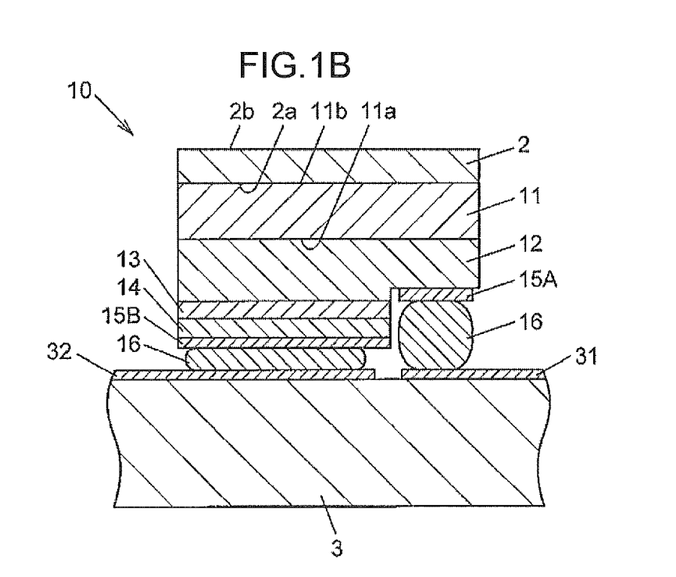
FIG. 1B is a cross sectional view showing a light-emitting element constituting the light-emitting device shown in FIG. 1A and the periphery thereof.

As shown in FIG. 1B, the light-emitting element 10 is mounted on the ceramic substrate 3 such that the n-side electrode 15A and the p-side electrode 15B are connected to the wiring parts 31 and 32 via bumps 16.

The light-emitting element 10 is a flip-chip type using, e.g., a GaN-based semiconductor compound and emits, e.g., blue light having a peak intensity at a wavelength of 380 to 490 nm. In the light-emitting element 10, an n-type GaN layer 12, a light-emitting layer 13 and a p-type GaN layer 14 are formed in this order on a first principal surface 11a of an element substrate 11 which is formed of sapphire, etc. The n-side electrode 15A is formed on an exposed portion of the n-type GaN layer 12 and the p-side electrode 15B is formed on a surface of the p-type GaN layer 14.

Carrier injection from the n-type GaN layer 12 and the p-type GaN layer 14 causes the light-emitting layer 13 to emit blue light. This emission light passes through the n-type GaN layer 12 and the element substrate 11 and is emitted from a second principal surface 11b of the element substrate 11. In other words, the second principal surface 11b of the element substrate 11 is the light-emitting surface of the light-emitting element 10.

In addition, the phosphor 2 is arranged on the element substrate 11 on the second principal surface 11b side so as to cover the entire second principal surface 11b. The phosphor 2 is made entirely of a single monocrystal and has a plate shape. The single monocrystal here means a crystal which has a size equal to or greater than the second principal surface 11b and of which entirety can be regarded as virtually one single crystal. In addition, a first surface 2a of the phosphor 2 facing the element substrate 11 is directly in contact with the element substrate 11 without interposing any other members between the first surface 2a and second principal surface 11b of the element substrate 11. The phosphor 2 and the element substrate 11 are joined by intermolecular force.

In addition, the phosphor 2 is a YAG (yttrium aluminum garnet)-based phosphor in the present embodiment. In more detail, the phosphor 2 has a composition having $Y_3Al_5O_{12}$ as a base and represented by $Y_{3-x-y}L_xM_yAl_{5-z}N_zO_{12-w}$, where L is Gd or Lu, M is one or more elements selected from the group consisting of Ce, Tb, Eu, Yb, Pr, Tm and Sm, N is Ga or In, $0 \leq x < 3$, $0 < y \leq 1$, $0 \leq z \leq 5$ and $-0.2 \leq w \leq 0.2$. Here, L is a component which cannot be a light emission center displacing Y. M is a component which can be a light emission center displacing Y (an activator). In addition, N is a component displacing Al.

Alternatively, the phosphor 2 may be a TSLAG (terbium scandium lutetium aluminum garnet)-based phosphor. In more detail, the phosphor 2 may have a composition having $Tb_3(Sc, Lu)_2Al_3O_{12}$ as a base and represented by $Tb_{3-x-y}Gd_xM_y(Sc, Lu)_{2-z}Al_{3-w}N_{z+w}O_{12-v}$, where M is one or more elements selected from the group consisting of Ce, Eu, Yb, Pr, Tm and Sm, N is Ga or In, $0 \leq x \leq 3$, $0 \leq y \leq 1$, $0 \leq z \leq 2$, $0 \leq w \leq 3$ and $-0.2 \leq v \leq 0.2$. Here, M is a component which can be a light emission center displacing Tb (an activator). In addition, N is a component displacing Sc, Lu. In this case, z is preferably in a range of $0.5 \leq z < 2$ since it is easy to suppress formation of defects such as cracks at the time of making a single crystal.

Alternatively, the phosphor 2 may be a phosphor having a composition represented by $Tb_{3-x-y}Gd_xM_yAl_{5-z-v}(Sc, Lu)_vN_zO_{12-w}$, where L is Gd or Lu, M is one or more elements selected from the group consisting of Ce, Tb, Eu, Yb, Pr, Tm and Sm, N is Ga or In, $0 \leq x < 3$, $0 < y \leq 1$, $0 \leq z < 5$, $0 < v < 2$ and $-0.2 \leq w \leq 0.2$.

It should be noted that, even in the case of using the TSLAG-based phosphor, a concentration of the activator which is represented by "y" in the above is desirably not less than 0.003 and not more than 0.2, and more desirably, not less than 0.01 and not more than 0.2. The activator concentration in such a range allows a thickness t of the phosphor 2 to be set within a preferred range and also concentration quenching to be suppressed.

Alternatively, the phosphor 2 may be a phosphor having a composition represented by $Tb_{3-x-y}Gd_xM_y(Sc, Lu)_vN_{5-v}O_{12-w}$, where M is at least one or more elements selected from the group consisting of Ce, Eu, Yb, Pr, Tm, Sm, Nd, Dy, Ho and Er, N is at least one or more elements selected from the group consisting of Ga, In and Al, $0 \leq x < 3$, $0 < y \leq 1$, $0 \leq v \leq 5$ and $-0.2 \leq w \leq 0.2$. In this case, v is preferably in a range of $0.5 \leq v \leq 2$ since it is easy to suppress formation of defects such as cracks at the time of making a single crystal.

Alternatively, the phosphor 2 may be a phosphor having a composition represented by $Y_{3-x-y}Gd_xM_yL_vN_{5-v}O_{12-w}$, where L is one or more elements selected from Sc and Lu, M is at least one or more elements selected from the group consisting of Ce, Tb, Eu, Yb, Pr, Tm, Sm, Nd, Dy, Ho and Er, N is at least one or more elements selected from the group consisting of Ga, In and Al, $0 \leq x < 3$, $0 < y \leq 1$, $0 \leq v \leq 5$ and $-0.2 \leq w \leq 0.2$. In this case, v is preferably in a range of $0.5 \leq v \leq 2$ since it is easy to suppress formation of defects such as cracks at the time of making a single crystal.

It should be noted that some atoms in the above-mentioned compositions of the phosphor 2 may be located at a different position in a crystal structure.

The concentration of the activator which is represented by "y" in the above should be not less than 0.003 and not more than 0.2. This is because, when the activator concentration is less than 0.003, the thickness t of the phosphor 2 which is required to obtain necessary fluorescence is large (e.g., t>3 mm) and this results in a decrease in the yield rate of the phosphors 2. On the other hand, the phosphor 2 needs to be thin (e.g., t<0.1 mm) when the activator concentration is more than 0.2, and accordingly, cracks or chips are likely to be generated in the phosphor 2 due to a decrease in mechanical strength of the phosphor 2 and concentration quenching may occur. Note that, the concentration quenching is a phenomenon in which inherent energy is not sufficiently radiated outward as fluorescence due to energy transfer which occurs between adjacent molecules (non-radiative transition) and this results in that fluorescence intensity does not increase with an increase in the activator concentration.

More preferably, the concentration of the activator which is represented by "y" in the above is preferably not less than 0.01 and not more than 0.2. Adjusting to y≥0.01 allows the phosphor 2 to have an appropriate thickness (e.g., t≤2 mm). In other words, the thickness t (mm) of the phosphor 2 is preferably 0.1≤t≤3.0, and more desirably, 0.1≤t≤2.0.

The phosphor 2 can be obtained by, e.g., a liquid phase growth method such as CZ method (Czochralski Method) EFG method (Edge Defined Film Fed Growth Method) and FZ method (Floating Zone Method), a vapor growth method such as CVD method (Chemical Vapor Deposition Method) or solid-phase reaction of sintered body, etc. In case of using the CZ method, the phosphor 2 can be formed as follows: For example, a YAG single crystal is made by pulling up a crystal seed in a <111> direction in a nitrogen gas atmosphere at a growth rate of 1 mm/h and is cut into a size corresponding to the second principal surface 11b (light-emitting surface) of the element substrate 11 of the light-emitting element 10.

Figure 2:
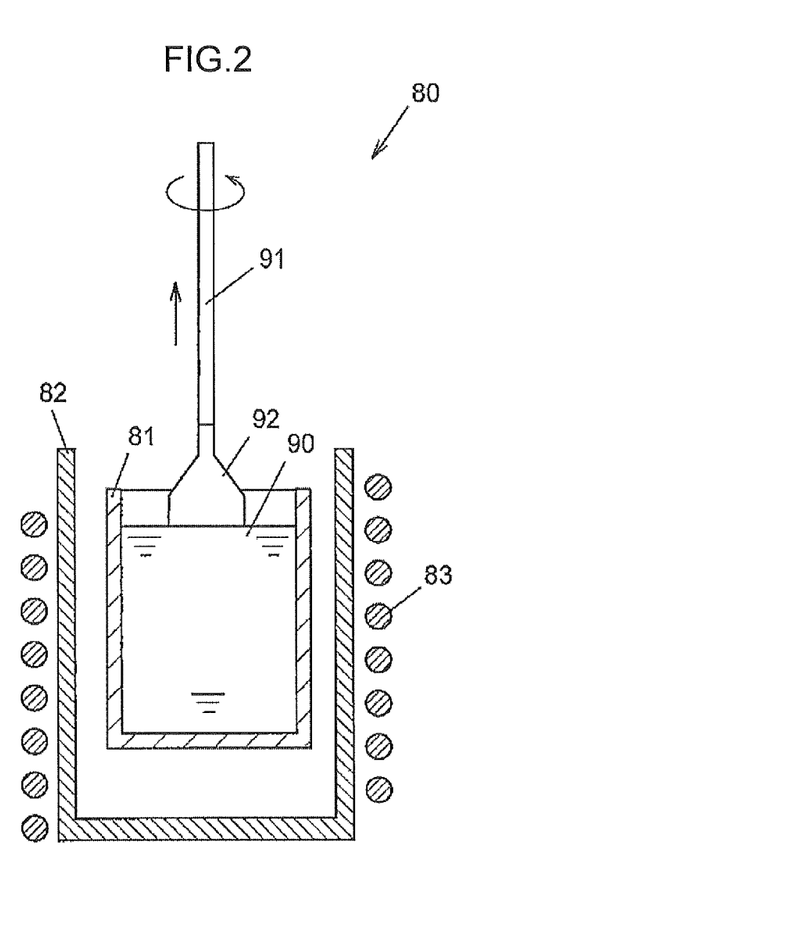
FIG. 2 is a schematic diagram illustrating a process of manufacturing a YAG single crystal by a CZ method, also showing a cross sectional view of a crystal growth apparatus.

FIG. 2 is a schematic diagram illustrating a process of manufacturing a YAG single crystal by a CZ method, also showing a cross sectional view of a crystal growth apparatus.

As shown in FIG. 2, a crystal growth apparatus 80 is mainly provided with a crucible 81 made of iridium, a cylindrical vessel 82 made of ceramics for housing the crucible 81 and a high-frequency coil 83 wound around the cylindrical vessel 82. The high-frequency coil 83 generates an induced current in the crucible 81, thereby heating the crucible 81.

Using the crystal growth apparatus 80, a YAG single crystal is obtained by, e.g., as follows. Firstly, $Y_2O_3$ powder (purity of 99.99%), $Al_2O_3$ powder (purity of 99.99%), $Gd_2O_3$ powder (purity of 99.99%) and $CeO_2$ powder (purity of 99.99%) are prepared and are dry-blended to obtain a mixed powder. At this time, respective blending ratios of the $Y_2O_3$ powder, the $Al_2O_3$ powder, the $Gd_2O_3$ powder and the $CeO_2$ powder based on the total number of moles (100%) of the $Y_2O_3$ powder, the $Al_2O_3$ powder, the $Gd_2O_3$ powder and the $CeO_2$ powder are, e.g., 36.6 mole %, 62.3 mole %, 0.363 mole % and 0.737 mole %.

Following this, the mixed powder is filled in the cylindrical crucible 81 having a diameter of 50 mm and a depth of 50 mm. Next, the crucible 81 is heated by applying an electric current to the high-frequency coil 83 to melt the mixed powder, thereby obtaining a melt 90. Then, a square bar-shaped seed crystal 91 formed of YAG (yttrium aluminum garnet) and having a size of 3×3×70 mm is prepared, a tip of the seed crystal 91 is dipped into the melt 90, and subsequently, the seed crystal 91 is pulled upwards at a pulling rate of 1 mm per hour while rotating at a rotating speed of 10 rpm. At this time, nitrogen is pumped into the cylindrical vessel 82 at a flow rate of 2 L per minute and the seed crystal 91 is pulled up in a nitrogen atmosphere under atmospheric pressure. As a result, a transparent YAG single crystal 92 having a diameter of about 2.5 cm and a length of about 5 cm is obtained.

When the light-emitting element 10 configured as described above is energized, electrons are injected into the light-emitting layer 13 via the wiring part 31, the n-side electrode 15A and the n-type GaN layer 12 while holes are injected into the light-emitting layer 13 via the wiring part 32, the p-side electrode 15B and the p-type GaN layer 14, which causes the light-emitting layer 13 to emit light. Blue emission light of the light-emitting layer 13 passes through the n-type GaN layer 12 and the element substrate 11, is emitted from the second principal surface 11b of the element substrate 11 and is incident on the first surface 2a of the phosphor 2.

A portion of the light incident from the first surface 2a serves as excitation light and excites the phosphor 2. The phosphor 2 absorbs a portion of the blue light from the light-emitting element 10 and converts a wavelength of the absorbed light into, e.g., yellow light having a peak intensity at a wavelength of 500 to 630 nm.

A portion of the blue light incident on the phosphor 2 is absorbed by the phosphor 2, is wavelength-converted and is emitted as yellow light from a second surface 2b of the phosphor 2. Meanwhile, the remaining portion of the light incident on the phosphor 2 is emitted from the second surface 2b of the phosphor 2 without being absorbed by the phosphor 2. Since blue and yellow are in a complementary color relationship, the light-emitting device 1 emits white light as a mixture of blue light and yellow light.

In addition, color temperature of white light emitted from the light-emitting device 1 is desirably from 3800 to 7000K. The more desirable color temperature of white light from the light-emitting device 1 is from 4000 to 5500K. It is possible to control the color temperature of white light by adjusting activator concentration and thickness, etc., of the phosphor 2.

Effects of the First Embodiment

In the present embodiment, since a binding agent (binder) used for binding and retaining multiple particulate phosphors is not required, it is possible to prevent a decrease in luminous efficiency caused by deterioration of the binding agent. In addition, since the total surface area of the entire phosphor can be smaller than the case of binding multiple particulate phosphors, it is possible to suppress the characteristic degradation of a phosphor caused by the influence of external environment and to enhance the uniformity of the composition of the phosphor and the crystalline quality thereof, thereby improving the luminous efficiency of the light-emitting device. In addition, it is possible to expect an effect that a decrease in efficiency due to the deterioration of resin and the deterioration of the phosphor is less likely to occur even under high-power excitation light irradiation.

In addition, since the YAG-based single crystal is used as the phosphor, blue light is efficiently absorbed to emit yellow light and it is thereby possible to efficiently obtain white light.

Still further, since the activator concentration of the phosphor 2 is determined to be not less than 0.003 and not more than 0.2, more preferably, not less than 0.01 and not more than 0.2, the phosphor 2 can have a thickness suitable for processing and assembly and it is also possible to suppress concentration quenching.

Second Embodiment

The second embodiment of the invention will be described below in reference to FIGS. 3A to 3C.

Figure 3A:
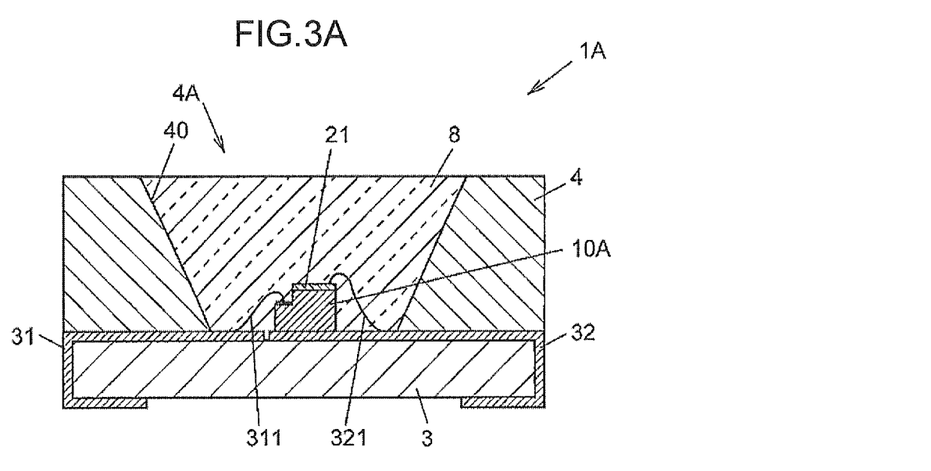
FIG. 3A is a cross sectional view showing a light-emitting device in a second embodiment of the invention.
Figure 3B:
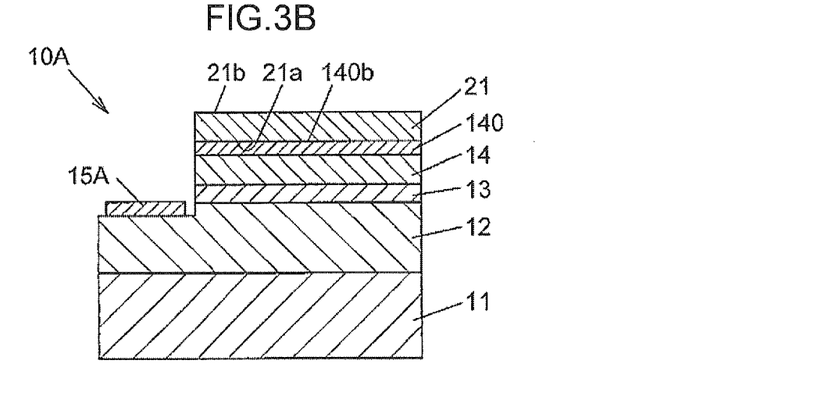
FIG. 3B is a cross sectional view showing a light-emitting element constituting the light-emitting device shown in FIG. 3A and the periphery thereof.
Figure 3C:
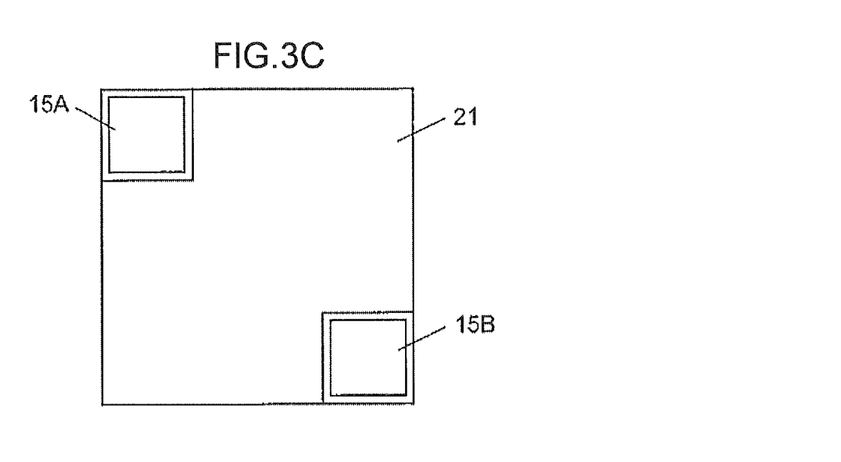
FIG. 3C is a plan view showing the light-emitting element constituting the light-emitting device shown in FIG. 3A.

FIG. 3A is a cross sectional view showing a light-emitting device 1A in the present embodiment, FIG. 3B is a cross sectional view showing a light-emitting element 10A constituting the light-emitting device 1A and the periphery thereof and FIG. 3C is a plan view showing the light-emitting element 10A.

In the light-emitting device 1A of the present embodiment, the configuration to convert a wavelength of emission light of the light-emitting element which is incident on the phosphor formed of a single monocrystal is the same as that of the light-emitting device 1 in the first embodiment but the structure of the light-emitting element and the position of the phosphor with respect to the light-emitting element are different from those in the first embodiment. Hereinafter, constituent elements of the light-emitting device 1A which have the same functions and structures as those described in the first embodiment are denoted by the same reference numerals and explanation thereof will be omitted.

As shown in FIGS. 3A and 3B, the light-emitting device 1A is arranged so that the element substrate 11 of the light-emitting element 10A faces the ceramic substrate 3. In addition, a phosphor 21 formed of a YAG-based single monocrystal is joined to the light-emitting element 10A on the opening 4A side. Here, phosphors having the compositions described in the first embodiment can be used as the phosphor 21.

As shown in FIGS. 3B and 3C, the light-emitting element 10A has the element substrate 11, the n-type GaN layer 12, the light-emitting layer 13 and the p-type GaN layer 14 and further includes a transparent electrode 140 formed of ITO (Indium Tin Oxide) on the p-type GaN layer 14. The p-side electrode 15B is formed on the transparent electrode 140. The transparent electrode 140 diffuses carriers injected from the p-side electrode 15B and then injects the carrier into the p-type GaN layer 14.

As show in FIG. 3C, the phosphor 21 is formed in a substantially square shape having cutouts at positions corresponding to the p-side electrode 15B and the n-side electrode 15A which is formed on the n-type GaN layer 12. In addition, a first surface 21a of the phosphor 21 located on the transparent electrode 140 side is joined to a surface 140b of the transparent electrode 140 by intermolecular force. The composition of the phosphor 21 is the same as that of the phosphor 2 in the first embodiment.

As shown in FIG. 3A, the n-side electrode 15A of the light-emitting element 10A is connected to the wiring part 31 of the ceramic substrate 3 by a bonding wire 311. Meanwhile, the p-side electrode 15B of the light-emitting element 10A is connected to the wiring part 32 of the ceramic substrate 3 by a bonding wire 321.

When the light-emitting element 10A configured as described above is energized, electrons are injected into the light-emitting layer 13 via the wiring part 31, the n-side electrode 15A and the n-type GaN layer 12 while holes are injected into the light-emitting layer 13 via the wiring part 32, the p-side electrode 15B, the transparent electrode 140 and the p-type GaN layer 14, which causes the light-emitting layer 13 to emit light.

Blue emission light of the light-emitting layer 13 passes through the p-type GaN layer 14 and the transparent electrode 140 and is emitted from the surface 140b of the transparent electrode 140. In other words, the surface 140b of the transparent electrode 140 is a light-emitting surface of the light-emitting element 10A. The light emitted from the surface 140b of the transparent electrode 140 is incident on the first surface 21a of the phosphor 21.

A portion of the light incident on the phosphor 21 from the first surface 21a serves as excitation light and excites the phosphor 21. The phosphor 21 absorbs a portion of the blue light from the light-emitting element 10A and converts a wavelength of the absorbed light mainly into yellow light. In more detail, the phosphor 21 is excited by blue light having a peak intensity at a wavelength of 380 to 490 nm emitted from the light-emitting element 10A and then emits yellow light having a peak intensity at a wavelength of 500 to 630 nm.

As such, a portion of the blue light incident on the phosphor 21 is absorbed by the phosphor 21, is wavelength-converted and is emitted as yellow light from a second surface 21b of the phosphor 21. Meanwhile, the remaining portion of the blue light incident on the phosphor 21 is emitted as-is from the second surface 21b of the phosphor 21 without being absorbed by the phosphor 21. Since blue and yellow are in a complementary color relationship, the light-emitting device 1A emits white light as a mixture of blue light and yellow light.

The same functions and effects as those described in the first embodiment are obtained also in the present embodiment.

Third Embodiment

The third embodiment of the invention will be described blow in reference to FIG. 4.

Figure 4:
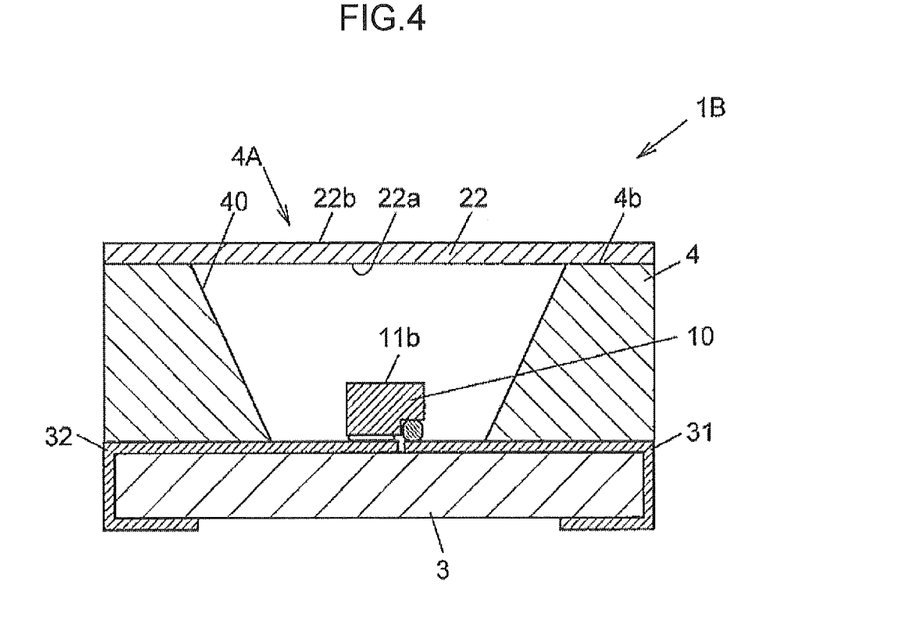
FIG. 4 is a cross sectional view showing a light-emitting device in a third embodiment of the invention.

FIG. 4 is a cross sectional view showing a light-emitting device 1B in the present embodiment.

In the light-emitting device 1B of the present embodiment, the configuration to convert a wavelength of emission light of the light-emitting element which is incident on the phosphor formed of a single monocrystal is the same as that of the light-emitting device 1 in the first embodiment but the position of the phosphor is different from that in the first embodiment. Hereinafter, constituent elements of the light-emitting device 1B which have the same functions and structures as those described in the first or second embodiment are denoted by the same reference numerals and explanation thereof will be omitted.

As shown in FIG. 4, in the light-emitting device 1B, the light-emitting element 10 having the same structure as that in the first embodiment is provided on the ceramic substrate 3. The light-emitting element 10 emits blue light toward the opening 4A of the main body 4 from the second principal surface 11b of the element substrate 11 (see FIG. 1B) located on an opening 4A side of the main body 4.

A phosphor 22 is joined to the main body 4 so as to cover the opening 4A. The phosphor 22 is formed in a plate-like shape and is bonded to an upper surface 4b of the main body 4 by an adhesive, etc. Phosphors having the compositions described in the first embodiment can be used as the phosphor 22. In addition, the phosphor 22 is larger than the light-emitting element 10 and the entirety thereof is virtually one single crystal.

The light-emitting element 10 emits light when the light-emitting device 1B configured as described above is energized, hence, blue light is emitted from the second principal surface 11b toward the phosphor 22. The blue emission light of the light-emitting element 10 is incident on the phosphor 22 from a first surface 22a facing the emitting surface of the light-emitting element 10, and yellow light resulting from excitation by the emission light is emitted from a second surface 22b to the outside.

As such, a portion of the blue light incident on the phosphor 22 is absorbed by the phosphor 22, is wavelength-converted and is emitted as yellow light from the second surface 22b of the phosphor 22. Meanwhile, the remaining portion of the blue light incident on the phosphor 22 is emitted from the second surface 22b of the phosphor 22 without being absorbed by the phosphor 22. Since blue and yellow are in a complementary color relationship, the light-emitting device 1B emits white light as a mixture of blue light and yellow light.

The same functions and effects as those described in the first embodiment are obtained also in the present embodiment. In addition, since the light-emitting element 10 is separated from the phosphor 22, it is possible to use a larger phosphor 22 than a phosphor joined to the emitting surface of the light-emitting element 10, which makes assembly of the light-emitting device 1B easier.

Fourth Embodiment

The fourth embodiment of the invention will be described below in reference to FIG. 5.

Figure 5:
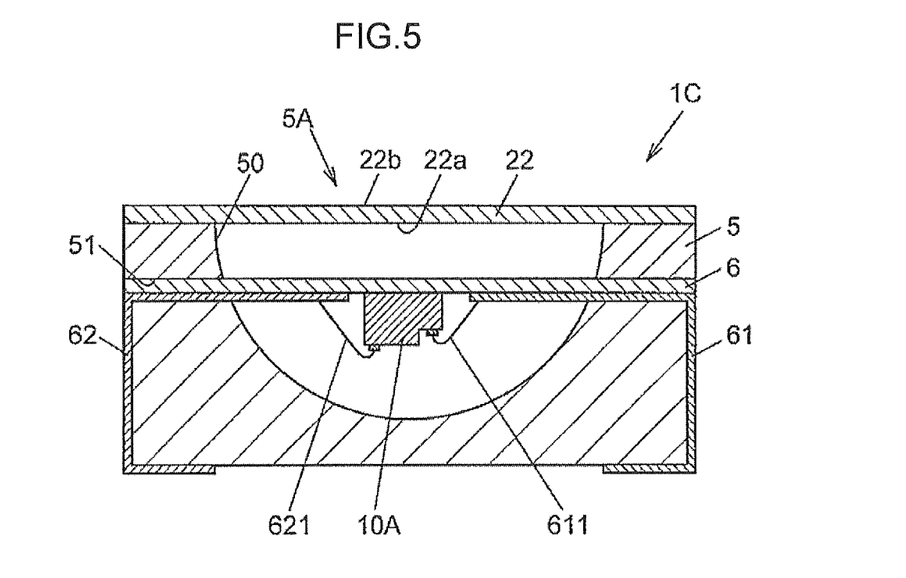
FIG. 5 is a cross sectional view showing a light-emitting device in a fourth embodiment of the invention.

FIG. 5 is a cross sectional view showing a light-emitting device 1C in the present embodiment. As shown in FIG. 5, a position of the light-emitting element with respect to the substrate mounting the light-emitting element and with respect to the phosphor in the present embodiment is different from that in the third embodiment. Hereinafter, constituent elements of the light-emitting device 1C which have the same functions and structures as those described in the first, second or third embodiment are denoted by the same reference numerals and explanation thereof will be omitted.

The light-emitting device 1C in the present modification is composed of a main body 5 formed of a white resin, a transparent substrate 6 held in a slit-like holding portion 51 formed on the main body 5, the phosphor 22 formed of a YAG-based single monocrystal and arranged so as to cover an opening 5A of the main body 5, the light-emitting element 10A mounted on a surface of the transparent substrate 6 opposite to the surface on the phosphor 22 side and wiring parts 61 and 62 for energizing the light-emitting element 10A. The composition of the phosphor 22 is the same as that of the phosphor 2 in the first embodiment.

In the main body 5, a concave portion on a curved surface shape is formed in the middle, and a surface of the concave portion serves as a reflecting surface 50 which reflects emission light of the light-emitting element 10A toward the phosphor 22.

The transparent substrate 6 is a translucent member formed of, e.g., a translucent resin such as silicone resin, acrylic resin and PET, etc., or a single crystal or polycrystal such as glassy substance, sapphire, ceramics and quartz, etc., and has translucency to emission light of the light-emitting element 10A and insulation properties. In addition, portions of the wiring parts 61 and 62 are joined to the transparent substrate 6. P-side and n-side electrodes of the light-emitting element 10A are electrically connected to end portions of the wiring parts 61 and 62 on one side by bonding wires 611 and 621. End portions of the wiring parts 61 and 62 on another side are drawn out from the main body 5.

The light-emitting element 10A emits light when the light-emitting device 1C configured as described above is energized, and a portion of the emission light passes through the transparent substrate 6 and is incident on the first surface 22a of the phosphor 22. Meanwhile, the remaining portion of the emission light is reflected by the reflecting surface 50 of the main body 5, passes through the transparent substrate 6 and is incident on the first surface 22a of the phosphor 22.

A portion of the light incident on the phosphor 22 is absorbed and wavelength-converted by the phosphor 22, and the remaining portion is emitted from the second surface 22b of the phosphor 22 without being absorbed by the phosphor 22. As such, the light-emitting device 1C emits white light as a mixture of blue light emitted from the light-emitting element 10A and yellow light wavelength-converted by the phosphor 22.

The same effects as those described in the third embodiment are obtained also in the present modification. In addition, light extraction efficiency of the light-emitting device 1C is enhanced since light of the light-emitting element 10A emitted toward a side opposite to the phosphor 22 is reflected by the reflecting surface 50, passes through the transparent substrate 6 and is incident on the phosphor 22.

Fifth Embodiment

The fifth embodiment of the invention will be described below in reference to FIGS. 6A and 6B.

Figure 6A:
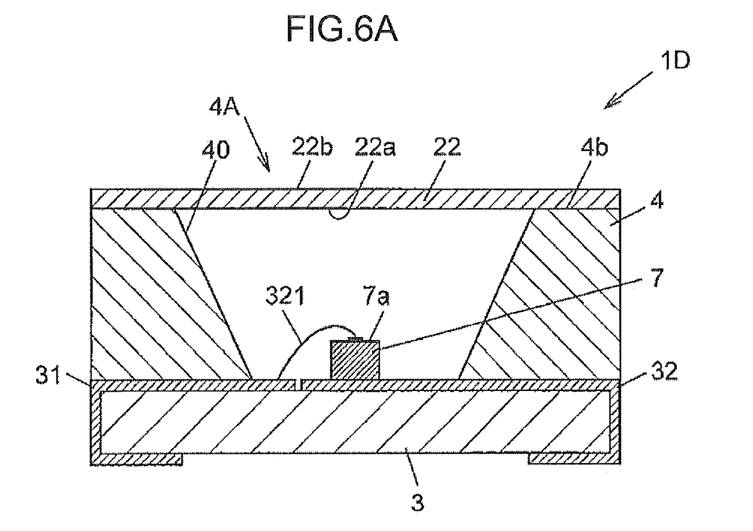
FIG. 6A is a cross sectional view showing a light-emitting device in a fifth embodiment of the invention.
Figure 6B:
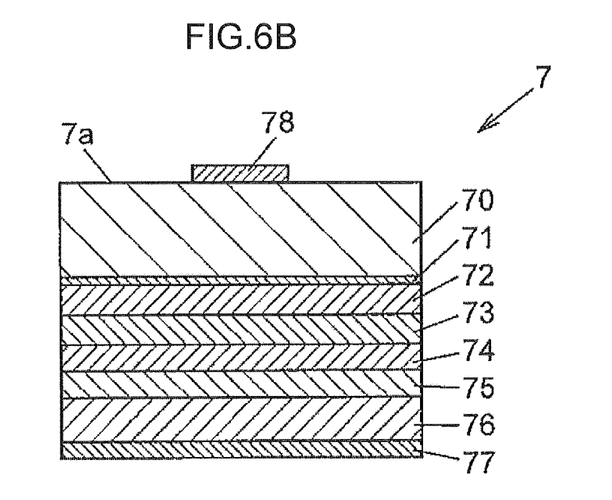
FIG. 6B is a cross sectional view showing a light-emitting element constituting the light-emitting device shown in FIG. 6A and the periphery thereof.

FIG. 6A is a cross sectional view showing a light-emitting device 1D in the present embodiment and FIG. 6B is a cross sectional view showing a light-emitting element 7 constituting the light-emitting device 1D. As shown in FIG. 6A, the present embodiment is different from the third embodiment in the structure and arrangement of the light-emitting element. Hereinafter, constituent elements of the light-emitting device 1D which have the same functions and structures as those described in the first, second or third embodiment are denoted by the same reference numerals and explanation thereof will be omitted.

In the light-emitting device 1D, the light-emitting element 7 is arranged on the wiring part 32 which is provided on the ceramic substrate 3. The light-emitting element 7 is formed by laminating a $Ga_2O_3$ substrate 70, a buffer layer 71, a Si-doped $n^+$-GaN layer 72, a Si-doped n-AlGaN layer 73, a MQW (Multiple-Quantum Well) layer 74, a Mg-doped p-AlGaN layer 75, a Mg-doped $p^+$-GaN layer 76 and a p-electrode 77 in this order, as shown in FIG. 6B. In addition, an n-electrode 78 is provided on a surface of the $Ga_2O_3$ substrate 70 opposite to the buffer layer 71.

The $Ga_2O_3$ substrate 70 is formed of $\beta$-$Ga_2O_3$ of an n-conductivity type. The MQW layer 74 is a light-emitting layer having an InGaN/GaN multiple quantum well structure. The p-electrode 77 is a transparent electrode formed of ITO (Indium Tin Oxide) and is electrically connected to the wiring part 32. The n-electrode 78 is connected to the wiring part 31 of the ceramic substrate 3 by the bonding wire 321. For the element substrate, SiC may be alternatively used instead of $\beta$-$Ga_2O_3$.

When the light-emitting element 7 configured as described above is energized, electrons are injected into the MQW layer 74 via the n-electrode 78, the $Ga_2O_3$ substrate 70, the buffer layer 71, the $n^+$-GaN layer 72 and the n-AlGaN layer 73 while holes are injected into the MQW layer 74 via the p-electrode 77, the $p^+$-GaN layer 76 and the p-AlGaN layer 75, and blue light is emitted. The blue emission light passes through the $Ga_2O_3$ substrate 70, etc., is emitted from an emitting surface 7a of the light-emitting element 7 and is incident on the first surface 22a of the phosphor 22.

The blue emission light of the light-emitting element 7 is incident on the phosphor 22 from the first surface 22a facing the emitting surface of the light-emitting element 7, and yellow light resulting from excitation by the emission light is emitted from the second surface 22b to the outside.

As such, a portion of the blue light incident on the phosphor 22 is absorbed and wavelength-converted by the phosphor 22, and is emitted as yellow light from the second surface 22b of the phosphor 22. Meanwhile, the remaining portion of the blue light incident on the phosphor 22 is emitted from the second surface 22b of the phosphor 22 without being absorbed by the phosphor 22. Since blue and yellow are in a complementary color relationship, the light-emitting device 1D emits white light as a mixture of blue light and yellow light.

The same functions and effects as those described in the third embodiment are obtained also in the present embodiment.

As is obvious from the above description, the invention is not intended to be limited to the above-mentioned embodiments and the illustrated examples, and various changes in design can be made without departing from the scope of each claim. For example, the light-emitting element and the phosphor may be sealed with a so-called bullet-shaped resin. Meanwhile, one light-emitting device may have plural light-emitting elements. Furthermore, the light-emitting device may be configured such that plural phosphors each formed of a single monocrystal are combined, such as a combination of a phosphor, which is formed of a single monocrystal and emits yellow light using blue light emitted from the light-emitting element as excitation light, with a phosphor formed of a single monocrystal and emitting light having a color different from that of the aforementioned phosphor.

EXPLANATION OF REFERENCE NUMERALS 1, 1A, 1B, 1C, 1D: light-emitting device
2, 21, 22: phosphor
3: ceramic substrate
2a, 21a, 22a: first surface
2b, 21b, 22b: second surface
4, 5: main body
51: holding portion
4A, 5A: opening
4b: upper surface
6: transparent substrate
10, 10A, 7: light-emitting element
11: element substrate
11a: first principal surface
11b: second principal surface
12: n-type GaN layer
13: light-emitting layer
14: p-type GaN layer
15A: n-side electrode
15B: p-side electrode
16: bump
31, 32, 61, 62: wiring part
311, 321, 611, 621: bonding wire
40, 50: reflecting surface
140: transparent electrode
140b: surface
70: $Ga_2O_3$ substrate
71: buffer layer
72: $n^+$-GaN layer
73: n-AlGaN layer
74: MQW layer
75: p-AlGaN layer
76: $p^+$-GaN layer
77: p-electrode
78: n-electrode
80: crystal growth apparatus
81: crucible
82: cylindrical vessel
83: high-frequency coil
90: melt
91: seed crystal
92: YAG single crystal

The invention claimed is:
1. A light-emitting device, comprising:
a light-emitting element to emit a blue light; and
a phosphor comprising a single monocrystal to emit a yellow light by being excited by the light emitted from the light-emitting element,
wherein the phosphor comprises a composition represented by $Y_{3-x-y}L_xM_yAl_{5-z}N_zO_{12-w}$, where L is Gd or Lu, M is one or more elements selected from the group consisting of Ce, Tb, Eu, Yb, Pr, Tm and Sm, N is Ga or In, $0 \leq x < 3$, $0.003 \leq y \leq 0.2$, $0 \leq z \leq 5$ and $-0.2 \leq w \leq 0.2$.
2. The light-emitting device according to claim 1, wherein the y of the phosphor is in a range of $0.01 \leq y \leq 0.2$.
3. The light-emitting device according to claim 1, wherein an entirety of the phosphor includes the single monocrystal.

4. A light-emitting device, comprising:
a light-emitting element to emit a blue light; and
a phosphor comprising a single monocrystal to emit a yellow light by being excited by the light emitted from the light-emitting element,
wherein the phosphor comprises a composition represented by $Tb_{3-x-y}Gd_xM_y(Sc, Lu)_{2-z}Al_{3-w}N_{z+w}O_{12-v}$, where M is one or more elements selected from the group consisting of Ce, Eu, Yb, Pr, Tm and Sm, N is Ga or In, $0 \leq x \leq 3$, $0 \leq y \leq 1$, $0 \leq z \leq 2$, $0 < w < 3$ and $-0.2 \leq v \leq 0.2$.
5. The light-emitting device according to claim 4, wherein the z of the phosphor is in a range of $0.5 \leq z \leq 2$.
6. A light-emitting device, comprising:
a light-emitting element to emit a blue light; and
a phosphor comprising a single monocrystal to emit a yellow light by being excited by the light emitted from the light-emitting element,
wherein the phosphor comprises a composition represented by $Tb_{3-x-y}Gd_xM_y(Sc, Lu)_vN_{5-v}O_{12-w}$, where M is at least one or more elements selected from the group consisting of Ce, Eu, Yb, Pr, Tm, Sm, Nd, Dy, Ho and Er, N is at least one or more elements selected from the group consisting of Ga, In and Al, $0 \leq x \leq 3$, $0 \leq y \leq 1$, $0 \leq v \leq 5$ and $-0.2 \leq w < 0.2$.
7. The light-emitting device according to claim 6, wherein the v of the phosphor is in a range of $0.5 \leq v \leq 2$.
8. A light-emitting device, comprising:
a light-emitting element to emit a blue light;
a phosphor comprising a single monocrystal to emit a yellow light by being excited by the light emitted from the light-emitting element;
a substrate that supports the light-emitting element;
a main body comprising a reflecting surface disposed around the light-emitting element;
a transparent resin that seals the light-emitting element and the phosphor; and
a wiring electrically connected to electrodes of the light-emitting element,
wherein the wiring is disposed on a upper surface of the substrate, and
wherein the main body and the transparent resin are disposed on an upper surface of the wiring.
9. The light-emitting device according to claim 8, wherein the light-emitting element comprises:
a p-type GaN layer disposed on a upper surface of one of the electrodes of the light-emitting element;
a light-emitting layer disposed on an upper surface of the p-type GaN layer; and
a n-type GaN layer disposed on a upper surface of the light-emitting layer.
10. The light-emitting device according to claim 9, further comprising:
an element substrate comprising sapphire,
wherein the n-type GaN layer is disposed on a first principal surface of the element substrate.
11. The light-emitting device according to claim 10, wherein the light-emitting layer emits the blue light from a carrier injection of the n-type GaN layer and the p-type GaN layer.
12. The light-emitting device according to claim 11, wherein the phosphor is disposed on a second principal surface of the element substrate.
13. The light-emitting device according to claim 12, wherein the single monocrystal includes a crystal which has a size equal to or greater than the second principal surface, and wherein an intermolecular force joins the phosphor to the element substrate.

14. The light-emitting device according to claim 10, wherein the phosphor is disposed on an entirety of a second principal surface of the element substrate.

* * * * *